US008510637B2

(12) United States Patent
Tseng et al.

(10) Patent No.: US 8,510,637 B2
(45) Date of Patent: *Aug. 13, 2013

(54) DATA READING METHOD, MEMORY STORAGE APPARATUS AND MEMORY CONTROLLER THEREOF

(75) Inventors: Chien-Fu Tseng, Yunlin County (TW); Kuo-Hsin Lai, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 206 days.

This patent is subject to a terminal disclaimer.

(21) Appl. No.: 13/108,004

(22) Filed: May 16, 2011

(65) Prior Publication Data

US 2011/0258496 A1     Oct. 20, 2011

Related U.S. Application Data

(63) Continuation-in-part of application No. 12/947,799, filed on Nov. 16, 2010, which is a continuation-in-part of application No. 12/788,649, filed on May 27, 2010.

(30) Foreign Application Priority Data

| Apr. 14, 2010 | (TW) | .............................. | 99111612 A |
| Sep. 17, 2010 | (TW) | .............................. | 99131626 A |
| Mar. 14, 2011 | (TW) | .............................. | 100108514 A |

(51) Int. Cl.
  *G11C 29/00* (2006.01)
  *G01R 31/30* (2006.01)

(52) U.S. Cl.
  USPC ............................ 714/773; 714/721; 714/745

(58) Field of Classification Search
  USPC .................. 714/721, 745, 704, 718, 719, 819, 714/824, 6.1, 42, 47.1, 47.2, 773, 763; 365/200, 365/201
  See application file for complete search history.

(56) References Cited

U.S. PATENT DOCUMENTS

| 5,677,899 | A | 10/1997 | Getreuer |
| 6,278,665 | B1 | 8/2001 | Schell et al. |
| 6,317,391 | B1 | 11/2001 | Schell et al. |
| 6,418,097 | B1 | 7/2002 | Schell et al. |
| 7,395,466 | B2 * | 7/2008 | Dempsey ...................... 714/721 |
| 7,983,082 | B2 * | 7/2011 | Park et al. ................ 365/185.09 |
| 2009/0006924 | A1 | 1/2009 | Ho |
| 2009/0168573 | A1 * | 7/2009 | Zhang et al. .................. 365/201 |
| 2012/0311402 | A1 | 12/2012 | Tseng et al. |

OTHER PUBLICATIONS

"Office Action of U.S. counterpart application" issued on Jul. 3, 2012, p. 1-p. 5.
"Notice of Allowance of U.S. counterpart application" issued on Feb. 22, 2013, p. 1-p. 9.

* cited by examiner

*Primary Examiner* — Christine Tu
(74) *Attorney, Agent, or Firm* — Jianq Chyun IP Office

(57) ABSTRACT

A data reading method for a writable non-volatile memory module having physical pages is provided. The method includes grouping the physical pages into a plurality of physical page groups. The method also includes reading first data from a physical page of a first physical page group by applying a first threshold voltage set. The method still includes, when the first data can be corrected by an error checking and correcting circuit and an error bit number corresponding to the first data is not smaller than an error bit number threshold, calculating compensation voltages for the first threshold voltage set. The method further includes adjusting the first threshold voltage set by the compensation voltages and applying the adjusted first threshold voltage set to read data from the physical pages of the first physical page group. Accordingly, data stored in the rewritable non-volatile memory module can be correctly read.

24 Claims, 11 Drawing Sheets

DATA READING METHOD, MEMORY STORAGE APPARATUS AND MEMORY CONTROLLER THEREOF

CROSS-REFERENCE TO RELATED APPLICATION

This application is a continuation-in-part of and claims the priority benefit of U.S. application Ser. No. 12/788,649, filed on May 27, 2010, now pending, which claims the priority benefit of Taiwan application serial no. 99111612, filed on Apr. 14, 2010 and U.S. application Ser. No. 12/947,799, filed on Nov. 16, 2010, now pending, which claims the priority benefit of Taiwan application serial no. 99131626, filed on Sep. 17, 2010. This application also claims the priority benefit of Taiwan application serial no. 100108514, filed on Mar. 14, 2011. The entirety of each of the above-mentioned patent applications is hereby incorporated by reference herein and made a part of this specification.

BACKGROUND

1. Technology Field

The present invention relates to a data reading method for a rewritable non-volatile memory module and particularly to a data reading method capable of effectively re-adjusting threshold voltages to correctly read data, and a memory controller and a memory storage apparatus using the method.

2. Description of Related Art

The growth of digital cameras, camera mobile phones, and MP3 players has been rapid in recent years. Consequently, demands of consumers for storage media of digital contents have increased drastically. Since flash memory has a characteristics of non-volatile data, energy saving, compact size, and without mechanical construction, the flash memory is suitable for users to carry on bodies as the storage media for transferring and exchanging the digital contents. Solid State Drive (SSD) is an example of utilizing the flash memory as the storage media, and has been widely applied in the computer host as a main hard disk.

A flash memory may be classified into a NOR flash memory or a NAND flash memory. Additionally, a NAND flash memory may be classified into a Multi Level Cell (MLC) NAND flash memory or a Single Level Cell (SLC) NAND flash memory according to the number of bits which each memory cell thereof is capable of storing. Each memory cell can store one bit of data in a SLC NAND flash memory, and each memory cell can store at least two bits of data in a MLC NAND flash memory. For example, taking a 4 level cell NAND flash memory as an example, each memory cell may store 2 bits of data (i.e., "11", "10", "00" or "01").

In a flash memory, memory cells are linked through bit lines and word lines to form a memory cell array. When a control circuit for controlling these bit and word lines reads/writes data from/to an assigned memory cell, float voltages of other memory cells may be disturbed, and thus error bits may occur (i.e., data (also referred to as "read data") read from a memory cell by the control circuit is different from data (also referred to as "write data") originally written into the memory cell). Or, when the flash memory is worn due to some factors (such as, unused for long-term, leakage of electricity or frequently erased), float voltages of memory cells may change and thus error bits may occur.

A memory storage apparatus is usually disposed with an error checking and correcting (ECC) circuit. When data is written, the ECC circuit generates an ECC code for the data. When subsequently the data is read, the ECC circuit performs error correcting and decoding (also referred to as an error correcting procedure) on the data according to the corresponding ECC code, so as to correct any error bit. However, the ECC circuit can only correct a limited number of error bits, and data cannot be corrected if the number of error bits in the data exceeds the number of error bits that can be corrected by the ECC circuit. In this case, the host system cannot correctly data read from the memory storage apparatus. The number of error bits will be increased due to the advancement in fabrication process and the characteristics of memory hardware structures (for example, the more data bits are stored in each memory cell of a MLC flash memory, the more error bits may occur). Thereby, how to ensure the accuracy of read data has become one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a data reading method, a memory controller, and a memory storage apparatus, wherein data stored in a rewritable non-volatile memory can be correctly read.

According to an exemplary embodiment of the invention, a data reading method for a rewritable non-volatile memory module is provided, wherein the rewritable non-volatile memory module has a plurality of physical pages. The data reading method includes grouping the physical pages into a plurality of physical page groups and setting a first threshold voltage set for a first physical page group among the physical page groups, wherein the first threshold voltage set includes a plurality of threshold voltages. The data reading method also includes reading first data from a first physical page by applying the first threshold voltage set, wherein the first physical page belongs to the first physical page group. The data reading method still includes, when the first data can be corrected by an error checking and correcting circuit to generate corrected data and an error bit number corresponding to the first data is not smaller than an error bit threshold, calculating a plurality of compensation voltages corresponding to the threshold voltages of the first threshold voltage set. The data reading method further includes adjusting the threshold voltages of the first threshold voltage set by using the compensation voltages and applies the adjusted first threshold voltage set to read data from the physical pages of the first physical page group.

According to an exemplary embodiment of the invention, a memory controller for controlling a rewritable non-volatile memory module is provided, wherein the rewritable non-volatile memory module has a plurality of physical pages. The memory controller includes a memory management circuit, a host interface, a memory interface, an error checking and correcting (ECC) circuit and a compensation voltage calculating circuit. The memory management circuit is configured to group the physical pages into a plurality of physical page groups and set a threshold voltage set for each of the physical pages, wherein a first threshold voltage set among the threshold voltage sets corresponds to a first physical page group among the physical page groups and the first threshold voltage set includes a plurality of threshold voltages. The host interface is coupled to the memory management circuit. The memory interface is coupled to the memory management circuit and configured for coupling to the rewritable non-volatile memory module. The error checking and correcting circuit is coupled to the memory management circuit. The compensation voltage calculating circuit is coupled to the memory management circuit. Herein, the memory management circuit reads first data from a first physical page by applying the first threshold voltage set, wherein the first physical page belongs to the first physical page group. Additionally, when the ECC circuit successfully corrects the first data to generate corrected data and an error bit number corresponding to the first data is not smaller than an error bit threshold, the compensation voltage calculating circuit calculates a plurality of compensation voltages corresponding to the threshold voltages of the first threshold voltage set.

According to an exemplary embodiment of the present invention, a memory storage apparatus including a connector, a rewritable non-volatile memory module and a memory controller is provided. The connector is configured to couple to the host system. The rewritable non-volatile memory module has a plurality of physical pages. The memory controller is coupled to the connector and the rewritable non-volatile memory module and has an ECC circuit. The memory controller is configured to group the physical pages into a plurality of physical page groups and set a threshold voltage set for each of the physical pages, wherein a first threshold voltage set among the threshold voltage sets corresponds to a first physical page group among the physical page groups and the first threshold voltage set includes a plurality of threshold voltages. Herein, the memory controller reads first data from a first physical page by applying the first threshold voltage set, wherein the first physical page belongs to the first physical page group. Furthermore, when the ECC circuit successfully corrects the first data to generate corrected data and an error bit number corresponding to the first data is not smaller than an error bit threshold, the memory controller calculates a plurality of compensation voltages corresponding to the threshold voltages of the first threshold voltage set.

According to an exemplary embodiment of the invention, a data reading method for reading data from a first physical page of a rewritable non-volatile memory module is provided, wherein the rewritable non-volatile memory module has a plurality of physical pages, the physical pages are grouped into a plurality of physical page groups, the first physical page belongs to a first physical page group among the physical page groups, the first physical page group corresponds a first threshold voltage set and a first threshold voltage flag, the first threshold voltage set includes a plurality of threshold voltages and the first threshold voltage flag is marked as a disabled status. The data reading method includes determining whether the first threshold voltage flag is marked as an enabled status. The data reading method also includes, if the first threshold voltage flag is not marked as the enabled status, applying the first threshold voltage set to read first data from the first physical page and determining whether the data read from the first physical page can be corrected to generate corrected data by an ECC circuit. The data reading method still includes, if the first data can be corrected to generate corrected data by the ECC circuit, determining whether an error bit number corresponding to the first data is smaller than an error bit threshold. The data reading method further includes, if an error bit number corresponding to the first data is not smaller than the error bit threshold, calculating a plurality of compensation voltages corresponding to the threshold voltages of the first threshold voltage set and marking the first threshold voltage flag as the enabled status.

Accordingly, the data reading method, the memory controller and the memory storage apparatus of the present invention are capable of correctly reading data.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the present invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
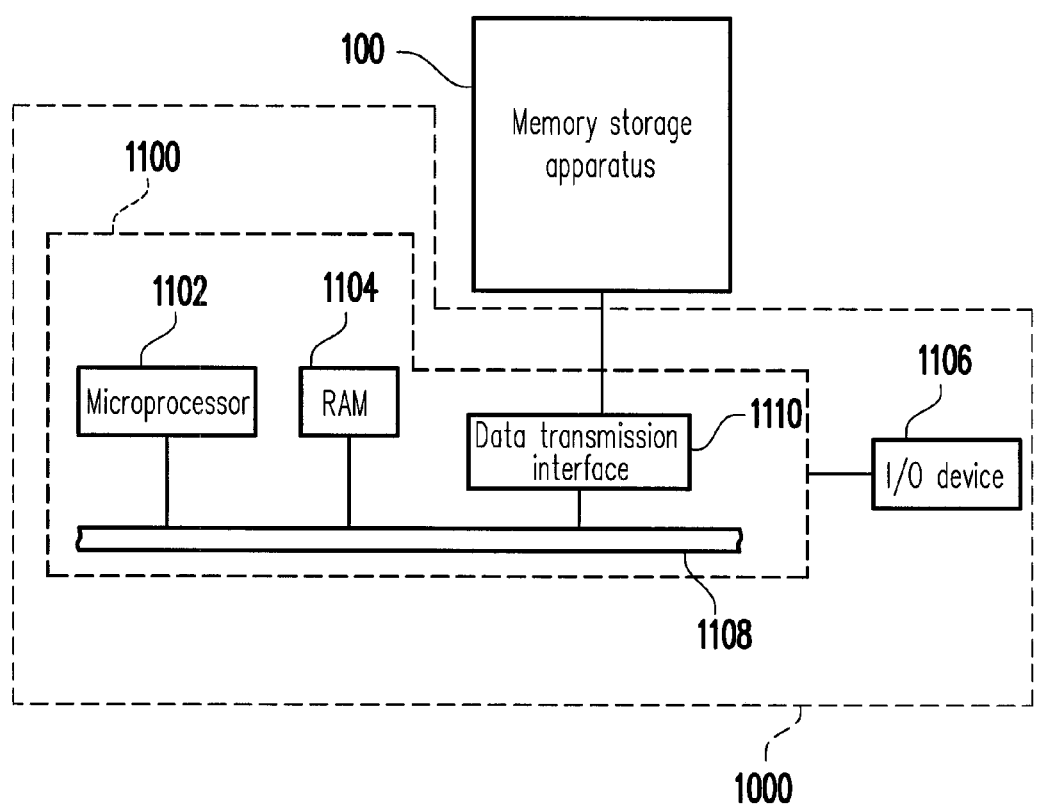
FIG. 1A is a block diagram of a host system and a memory storage apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In the exemplary embodiment of the present invention, physical pages of a rewritable non-volatile memory module are grouped into a plurality of physical page groups and a plurality of threshold voltage sets are set respectively for the physical page groups. And, data stored in the physical pages of one physical page group is read by applying a corresponding threshold voltage set. In particular, when the read data can be corrected successfully and the number of error bits occurred on the read data is smaller than an error bit threshold, a plurality of compensation voltages corresponding to the threshold voltage set are calculated according to information contained the error bits (also referred to as "error bit information"). And, when data is read from these physical pages next time, the threshold voltage set is adjusted by the calculated compensation voltages and the adjusted threshold voltage set is applied to read the data. Because the threshold voltage sets are adjusted dynamically according to the wear degrees of the physical pages (or memory cells), the accuracy of the read data can be ensured more effectively. Several exemplary embodiments are described below to illustrate the present invention in detail.

A memory storage apparatus (i.e. a memory storage system), typically, includes a rewritable non-volatile memory module and a controller (i.e., a control circuit). The memory storage apparatus is usually used together with a host system so that the host system can write data into or read data from the memory storage apparatus.

FIG. 1A is a block diagram of a host system and a memory storage apparatus according to an exemplary embodiment of the present invention.

Figure 1B:
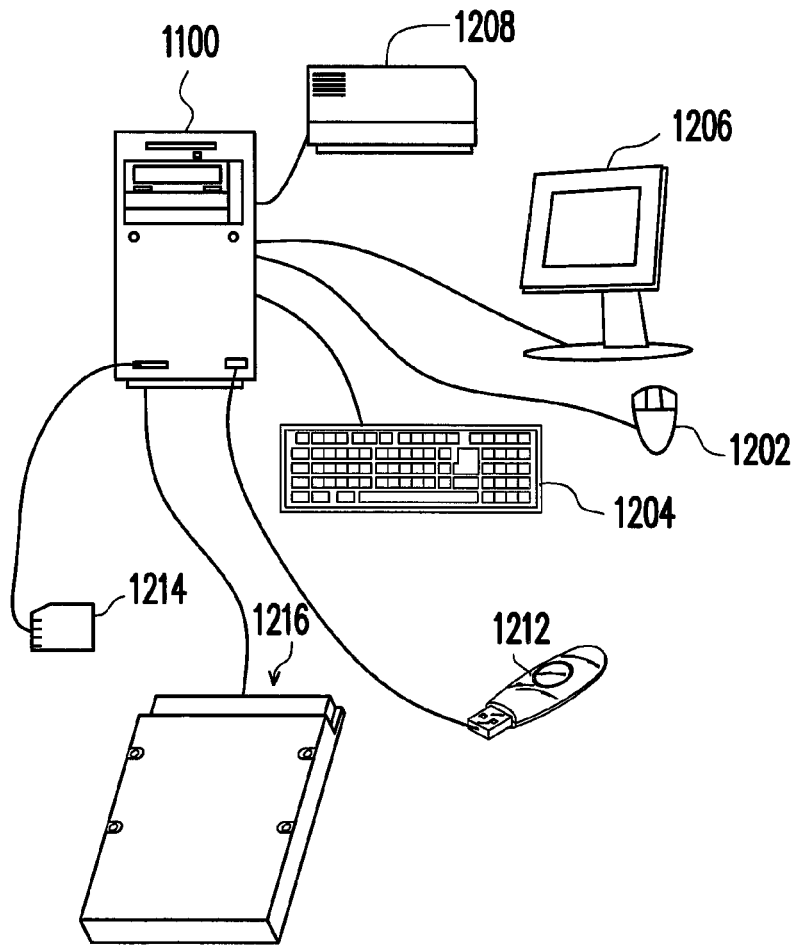
FIG. 1B is a diagram illustrating a computer, an input/output (I/O) device, and a memory storage apparatus according to an exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108 and a data transmission interface 1110. The I/O device 1106 includes a mouse 1202, a keyboard 1204, a display 1206, and a printer 1208 as shown in FIG. 1B. It should be noted that the devices in FIG. 1B do not limit the I/O device 1106; the I/O device 1106 may include other devices.

In the present exemplary embodiment, the memory storage apparatus 100 is coupled to the devices of the host system 1000 through the data transmission interface 1110. By using the microprocessor 1102, the random access memory (RAM) 1104 and the Input/Output (I/O) device 1106, the data can be write into the memory storage apparatus 100 or can be read from the memory storage apparatus 100. For example, the memory storage apparatus 100 may be a rewritable non-volatile memory storage apparatus, such as a flash drive 1212, a memory card 1214, or a solid state drive (SSD) 1216 shown in FIG. 1B.

Figure 1C:
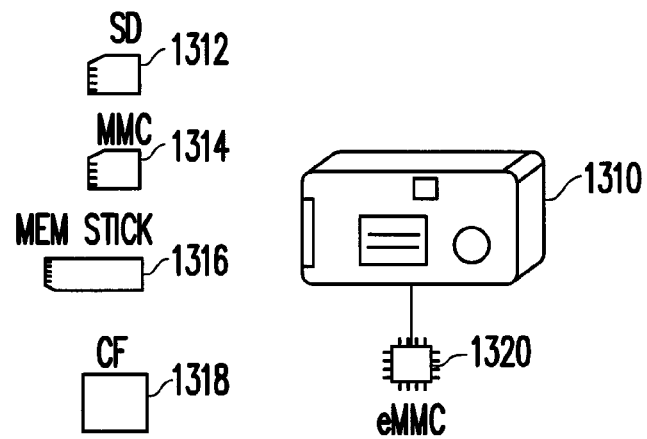
FIG. 1C is a diagram of a host system and a memory storage apparatus according to another exemplary embodiment of the present invention.

Generally, the host system 1000 substantially could be any system capable of operating with the memory storage apparatus 100 to store data. Even though the host system 1000 is described as a computer system in the present exemplary embodiment, in another exemplary embodiment of the present invention, the host system 1000 may also be a digital camera, a video camera, a communication device, an audio player, or a video player, and etc. For example, if the host system is a digital camera (video camera) 1310, the memory storage apparatus is then a SD card 1312, a MMC card 1314, a memory stick 1316, a CF card 1318 or an embedded storage device 1320 (as shown in FIG. 1C). The embedded storage device 1320 includes an embedded MMC (eMMC). It should be noted that the eMMC is directly coupled to the substrate of the host system.

Figure 2:
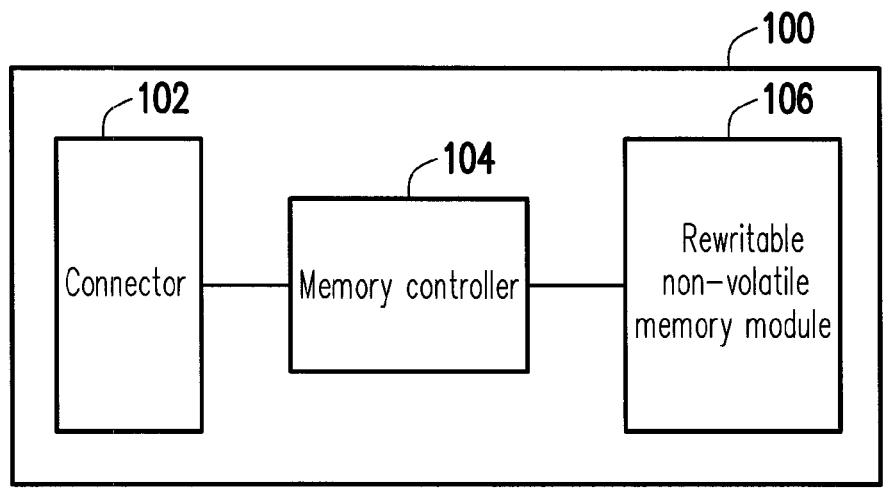
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a rewritable non-volatile memory module 106.

In the present exemplary embodiment, the connector 102 complies with a serial advanced technology attachment (SATA) standard. However, it should be noticed that the present invention is not limited to the aforementioned description and the connector 102 also can complies with an institute-of-electrical-and-electronic-engineers (IEEE) 1394 standard, a peripheral-component Interconnect-express (PCI Express) standard, a universal serial bus (USB) standard, a secure digital (SD) interface standard, a memory stick (MS) interface standard, a multi-media-card (MMC) interface standard, a compact flash (CF) interface standard, an integrated-device-electronics (IDE) standard or other suitable standards.

The memory controller 104 executes a plurality of logic gates or control instructions implemented in a hardware form or a firmware form and performs various data operations such as data writing, reading, and erasing in the rewritable non-volatile memory module 106 according to commands from the host system 1000.

The rewritable non-volatile memory module 106 is coupled to the memory controller 104 and configured for storing data written by the host system 1000. In the present exemplary embodiment, the rewritable non-volatile memory module 106 is a multi level cell (MLC) NAND flash memory module. However, the present invention is not limited thereto, and the rewritable non-volatile memory module 106 may also be other flash memory module or other memory module having the same characteristic.

Figure 3:
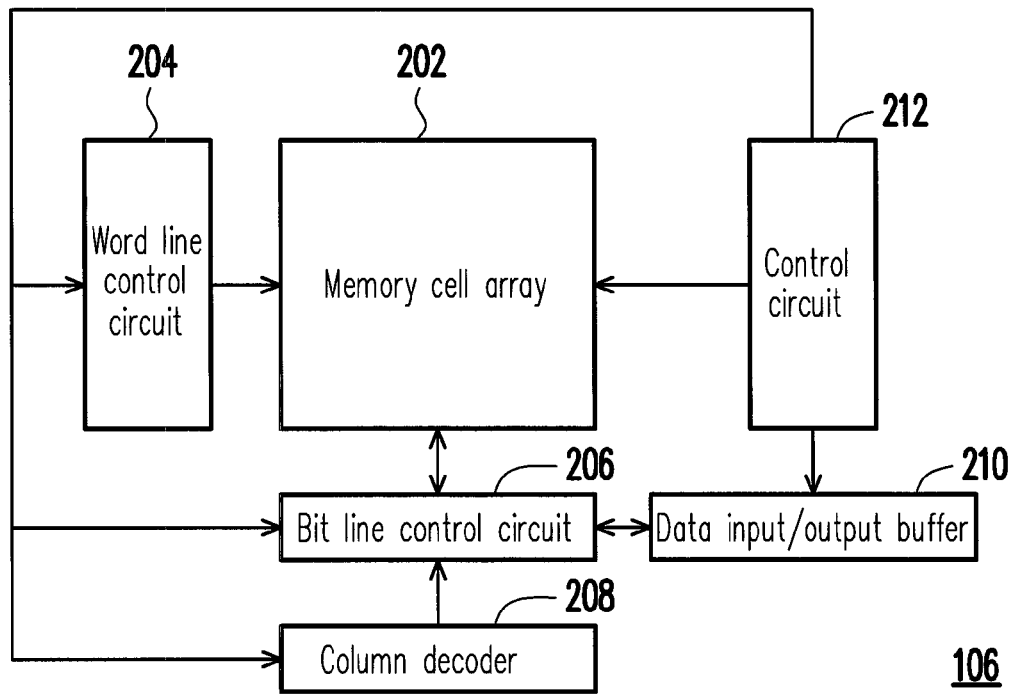
FIG. 3 is a schematic block diagram of a rewritable non-volatile memory module according to an exemplary embodiment of the present invention.

FIG. 3 is a schematic block diagram of a rewritable non-volatile memory module according to an exemplary embodiment of the present invention.

The rewritable non-volatile memory module 106 includes a memory cell array 202, a word line control circuit 204, a bit line control circuit 206, a column decoder 208, a data input/output (I/O) buffer 210, and a control circuit 212.

The memory cell array 202 includes a plurality of memory cells (not shown) for storing data, a plurality of bit lines (not shown) for connecting the memory cells, a plurality of word lines, and a common source line (not shown). The memory cells are disposed on the cross points of the bit lines and the word lines as an array. When a write command or a read command is received from the memory controller 104, the control circuit 212 controls the word line control circuit 204, the bit line control circuit 206, the column decoder 208, and the data I/O buffer 210 to write data into the memory cell array 202 or read data from the memory cell array 202, wherein the word line control circuit 204 controls the word line voltages applied to the word lines, the bit line control circuit 206 controls the bit lines, the column decoder 208 selects the corresponding bit line according to the decoding column address in the command, and the data I/O buffer 210 stores the data temporarily.

In the present exemplary embodiment, the rewritable non-volatile memory module 106 is a MLC NAND flash memory module, wherein a plurality of floating voltages is used for representing a multi-bit data. To be specific, each memory cell of the memory cell array 202 has a plurality of storage states, and the storage states are distinguished by a plurality of threshold voltages.

Figure 4:
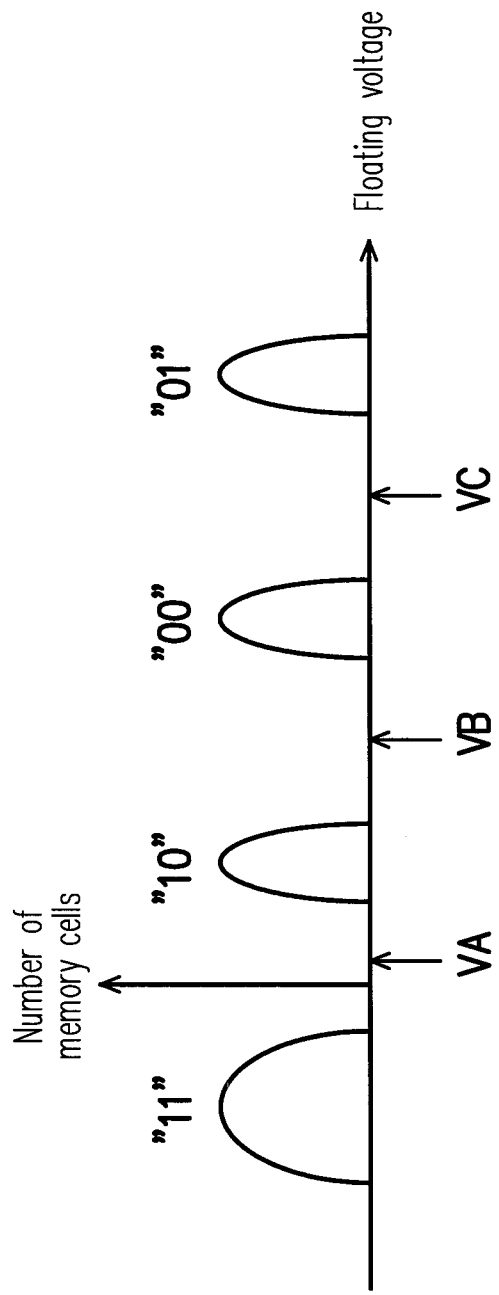
FIG. 4 is a statistical distribution diagram of float voltages corresponding to data stored in a memory array according to an exemplary embodiment of the present invention.

FIG. 4 is a statistical distribution diagram of float voltages corresponding to data stored in a memory array according to an exemplary embodiment of the present invention.

Referring to FIG. 4, taking a 4-level cell NAND flash memory as an example, the floating voltage in each memory cell can be distinguished into 4 storage states according to a first threshold voltage VA, a second threshold voltage VB, and a third threshold voltage VC, and these storage states respectively represent "11", "10", "00", and "01". In other words, each storage state includes the least significant bit (LSB) and the most significant bit (MSB). In the present exemplary embodiment, the first bit from the left of the storage states (i.e., "11", "10", "00", and "01") is the LSB, and the second bit from the left of the storage states is the MSB. Thus, in the present exemplary embodiment, each memory cell stores data of 2 bits. It should be understood that the floating voltages and the storage states illustrated in FIG. 3 are only examples. In another exemplary embodiment of the invention, the storage states may also have such an arrangement as "11", "10", "01", and "00" along with the increase of the floating voltages. Or, the storage states corresponding to the floating voltages may also be values obtained by mapping or inverting actual storage values. Additionally, in yet another exemplary embodiment, the first bit from the left may also be defined as the MSB while the second bit from the left as the LSB.

In the present exemplary embodiment, each memory cell stores data of 2 bits. Thus, the memory cells on the same word line constitute a storage space of 2 physical pages (i.e., a lower page and an upper page). Namely, the LSB of each memory cell is corresponding to the lower page, and the MSB of each memory cell is corresponding to the upper page. Besides, several physical pages in the memory cell array 202 constitute a physical block. Herein, physical block is the smallest unit for erasing data. Namely, each physical block contains the least number of memory cells that are erased together.

To write data into a memory cell of the memory cell array 202, the floating voltage of the memory cell is changed with an injection voltage so that a different storage state is presented. For example, when the lower page data is 1 and the upper page data is also 1, the control circuit 212 controls the word line control circuit 204 to not change the floating voltage in the memory cell, so as to keep the storage state of the memory cell as "11". When the lower page data is 1 and the upper page data is 0, the control circuit 212 controls the word line control circuit 204 to change the floating voltage in the memory cell, so as to change the storage state of the memory cell to "10". When the lower page data is 0 and the upper page data is also 0, the control circuit 212 controls the word line control circuit 204 to change the floating voltage in the memory cell, so as to change the storage state of the memory cell to "00". And, when the lower page data is 0 and the upper page data is 1, the control circuit 212 controls the word line control circuit 204 to change the floating voltage in the memory cell, so as to change the storage state of the memory cell to "01".

Figure 5:
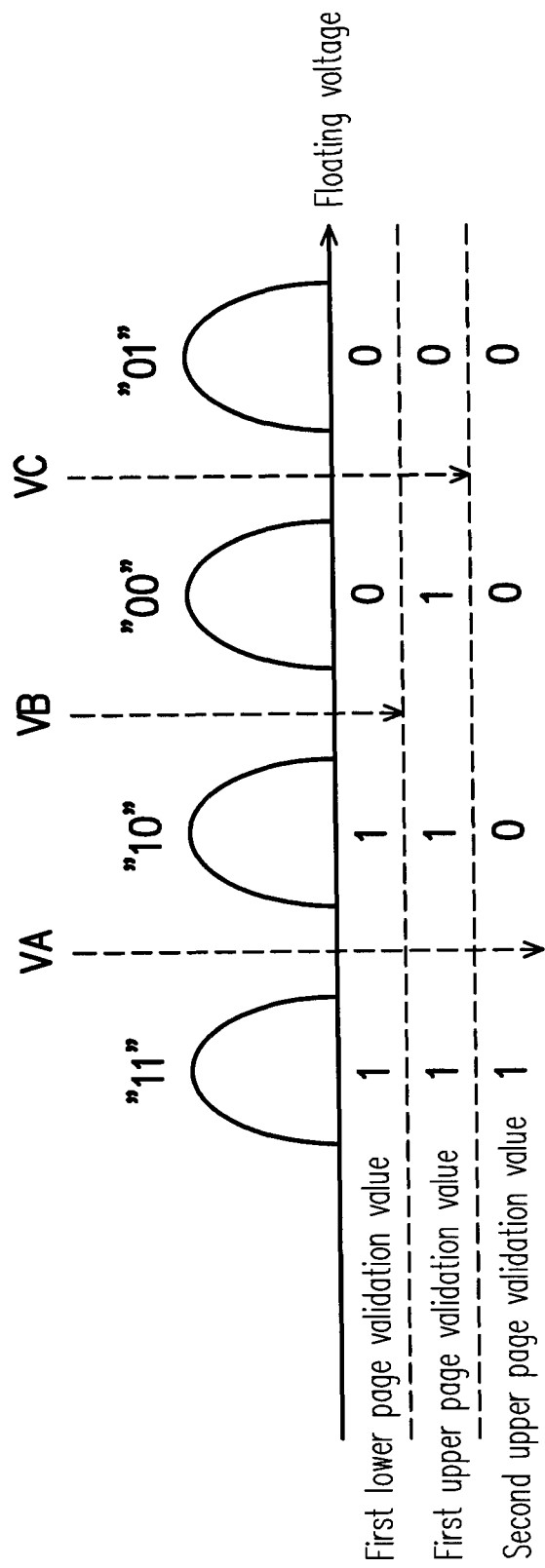
FIG. 5 is a diagram of reading data from one memory cell according to an exemplary embodiment of the present invention.

FIG. 5 is a diagram of reading data from one memory cell according to an exemplary embodiment of the present invention.

Referring to FIG. 5, the floating voltage in a memory cell of the memory cell array 202 is distinguished by applying threshold voltages, so as to read data from the memory cell. In an operation for reading data from a lower page, the word line control circuit 204 applies the second threshold voltage VB to the memory cell and determines the value of the lower page data according to whether a control gate of the memory cell is turned on and following expression (1):

$$\text{LSB} = (VB)\text{Lower\_pre1} \tag{1}$$

In foregoing expression (1), (VB)Lower_pre1 represents a first lower page validation value obtained by applying the second threshold voltage VB.

For example, when the second threshold voltage VB is lower than the floating voltage in the memory cell, the control gate of the memory cell is not turned on and a first lower page validation value, which is '0', is output. Accordingly, the LSB is identified as 0. When the second threshold voltage VB is higher than the floating voltage in the memory cell, the control gate of the memory cell is turned on and a first lower page validation value, which is '1', is output. Accordingly, the LSB is identified as 1. Namely, the floating voltage for presenting the LSB as value 1 and the floating voltage for presenting the LSB as value 0 can be distinguished by the second threshold voltage VB.

In an operation for reading data from an upper page, the word line control circuit 204 respectively applies the third threshold voltage VC and the first threshold voltage VA to the memory cell and determines the value of the upper page data according to whether the control gate of the memory cell is turned on and following expression (2):

$$\text{MSB} = ((VA)\text{Upper\_pre2}) \text{ xor } (\sim(VC)\text{Upper\_pre1}) \tag{2}$$

In foregoing expression (2), (VC)Upper_pre1 represents a first upper page validation value obtained by applying the third threshold voltage VC, and (VA)Upper_pre2 represents a second upper page validation value obtained by applying the first threshold voltage VA, wherein the symbol "~" represents inversion. Additionally, in the present exemplary embodiment, when the third threshold voltage VC is lower than the floating voltage in the memory cell, the control gate of the memory cell is not turned on and a first upper page validation value ((VC)Upper_pre1), which is '0', is output, and when the first threshold voltage VA is lower than the floating voltage in the memory cell, the control gate of the memory cell is not turned on and a second upper page validation value ((VA)Upper_pre2), which is '0', is output.

Thus, in the present exemplary embodiment, according to the expression (2), when the third threshold voltage VC and the first threshold voltage VA are both lower than the floating voltage in the memory cell and the third threshold voltage VC is applied, the control gate of the memory cell is not turned on and a first upper page validation value, which is '0', is output, and under the first threshold voltage VA, the control gate of the memory cell is not turned on and a second upper page validation value, which is '0', is output. Herein, the MSB is identified as 1.

For example, when the third threshold voltage VC is higher than the floating voltage of the memory cell and the first threshold voltage VA is lower than the floating voltage of the memory cell and the third threshold voltage VC is applied, the control gate of the memory cell is turned on and a first upper page validation value, which is '1', is output, and under the first threshold voltage VA, the control gate of the memory cell is not turned on and a second upper page validation value, which is '0', is output. Herein, the MSB is identified as 0.

For example, when the third threshold voltage VC and the first threshold voltage VA are both higher than the floating voltage of the memory cell and the third threshold voltage VC is applied, the control gate of the memory cell is turned on and a first upper page validation value, which is '1', is output, and under the first threshold voltage VA, the control gate of the memory cell is turned on and a second upper page validation value, which is '1', is output. Herein, the MSB is identified as 1.

Even though the present embodiment is described by taking a 4-level cell NAND flash memory as an example, the invention is not limited thereto, and data can be read from any other MLC NAND flash memory through the technique described above.

Figure 6:
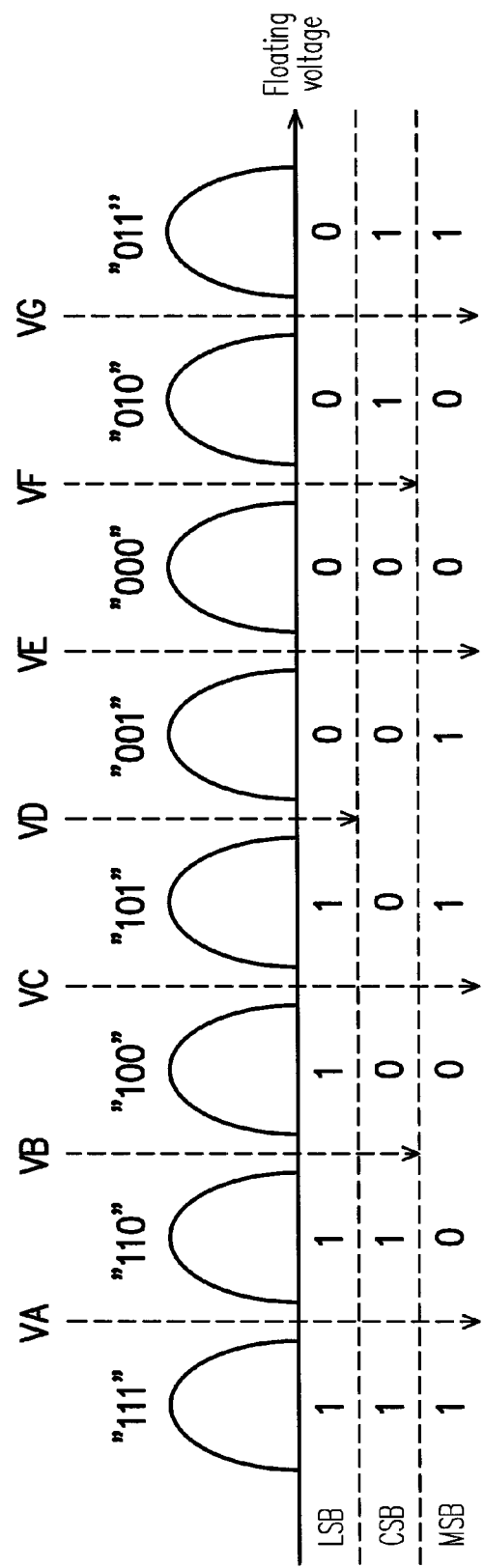
FIG. 6 is a diagram of reading data from one memory cell in an 8 level cell NAND flash memory according to another exemplary embodiment of the present invention.

Taking an 8-level cell NAND flash memory (as shown in FIG. 6) as an example, each storage state includes a LSB (the first bit from the left), a center significant bit (CSB, the second bit from the left), and a MSB (the third bit from the left), wherein the LSB is corresponding to a lower page, the CSB is corresponding to a middle page, and the MSB is corresponding to an upper page. In this example, the floating voltage in each memory cell is distinguished into 8 storage states (i.e., "111", "110", "100", "101", "001", "000", "010", and "011") according to a first threshold voltage VA, a second threshold voltage VB, a third threshold voltage VC, a fourth threshold voltage VD, a fifth threshold voltage VE, a sixth threshold voltage VF, and a seventh threshold voltage VG.

Figure 7:
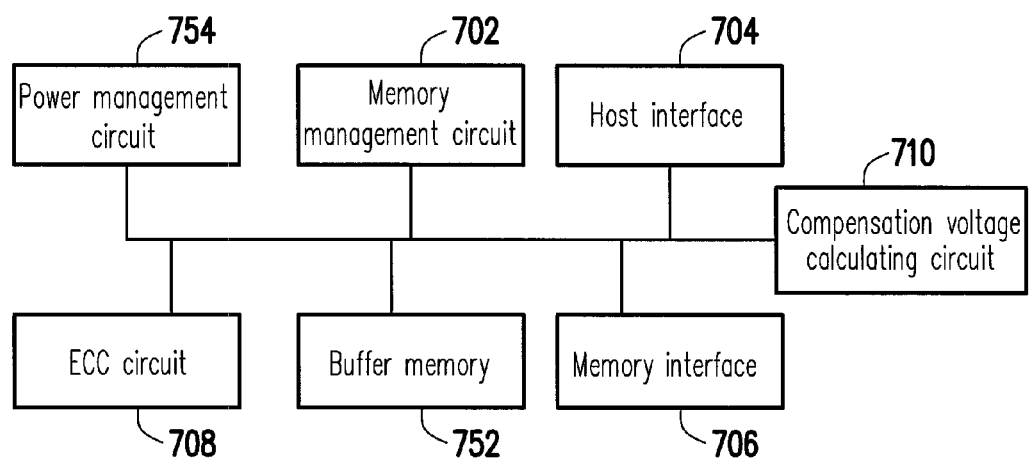
FIG. 7 is a schematic block diagram of a memory controller according to an exemplary embodiment of the present invention.

FIG. 7 is a schematic block diagram of a memory controller according to an exemplary embodiment of the present invention.

Referring to FIG. 7, the memory controller 104 includes a memory management circuit 702, a host interface 704, a memory interface 706, an error checking and correcting (ECC) circuit 708, and a compensation voltage calculating circuit 710.

The memory management circuit 702 controls the overall operation of the memory controller 104. To be specific, the memory management circuit 702 has a plurality of control instructions, and when the memory storage apparatus 100 is in operation, the control instructions are executed to perform various data operations on the rewritable non-volatile memory module 106 according to instructions of the host system 1000.

In the present exemplary embodiment, the control instructions of the memory management circuit 702 are implemented in a firmware form. For example, the memory management circuit 702 has a microprocessor unit (not shown) and a read-only memory (ROM, not shown), and the control instructions are burnt into the ROM. When the memory storage apparatus 100 is in operation, the control instructions are executed by the microprocessor unit.

In another exemplary embodiment of the invention, the control instructions of the memory management circuit 702 may also be stored in a specific area of the rewritable non-volatile memory module 106 (for example, a system area exclusively used for storing system data in a memory module) as program codes. Besides, the memory management circuit 702 has a microprocessor unit (not shown), a ROM (not shown), and a RAM (not shown). In particular, the ROM has a driving code, and when the memory controller 104 is enabled, the microprocessor unit first executes the driving code to load the control instructions from the rewritable non-volatile memory module 106 into the RAM of the memory management circuit 702. Thereafter, the microprocessor unit runs the control instructions to execute different data operations. Additionally, in another exemplary embodiment of the invention, the control instructions of the memory management circuit 702 may also be implemented in a hardware form.

The host interface 704 is coupled to the memory management circuit 702 and configured for receiving and identifying commands and data received from the host system 1000. Namely, commands and data transmitted by the host system 1000 are sent to the memory management circuit 702 through the host interface 704. In the present exemplary embodiment, the host interface 704 is compatible to the SATA standard. However, the invention is not limited thereto, and the host interface 704 may also be compatible to the PATA standard, the IEEE 1394 standard, the PCI express standard, the USB standard, the SD standard, the MS standard, the MMC standard, the CF standard, the IDE standard, or any other suitable data transmission standard.

The memory interface 706 is coupled to the memory management circuit 702 and configured to access the rewritable non-volatile memory module 106. Namely, data to be written into the rewritable non-volatile memory module 106 is converted by the memory interface 706 into a format acceptable to the rewritable non-volatile memory module 106.

The ECC circuit 708 is coupled to the memory management circuit 702 and configured to execute an ECC procedure to ensure data accuracy. To be specific, when the memory management circuit 702 receives a write command from the host system 1000, the ECC circuit 708 generates a corresponding ECC code for the data corresponding to the write command, and the memory management circuit 702 writes the data corresponding to the write command and the corresponding ECC code into the rewritable non-volatile memory module 106. Subsequently, when the memory management circuit 702 reads the data from the rewritable non-volatile memory module 106, it also reads the ECC code corresponding to the data, and the ECC circuit 708 executes the ECC procedure on the data according to the ECC code.

The compensation voltage calculating circuit 710 is coupled to the memory management circuit 702 and configured to calculate compensation threshold voltages according to error bit information contained in the read data. In particular, the memory management circuit 702 adjusts threshold voltage sets for reading data according to the compensation threshold voltages calculated by the compensation voltage calculating circuit 710. The methods of calculating compensation voltages and adjusting threshold voltage sets will be described in detail later.

In an exemplary embodiment of the invention, the memory controller 104 further includes a buffer memory 752. The buffer memory 752 is coupled to the memory management circuit 702 and configured to temporarily store data and commands received from the host system 1000 or data received from the rewritable non-volatile memory module 106.

In an exemplary embodiment of the invention, the memory controller 104 further includes a power management circuit 754. The power management circuit 754 is coupled to the memory management circuit 702 and configured to control the power supply of the memory storage apparatus 100.

Figure 8:
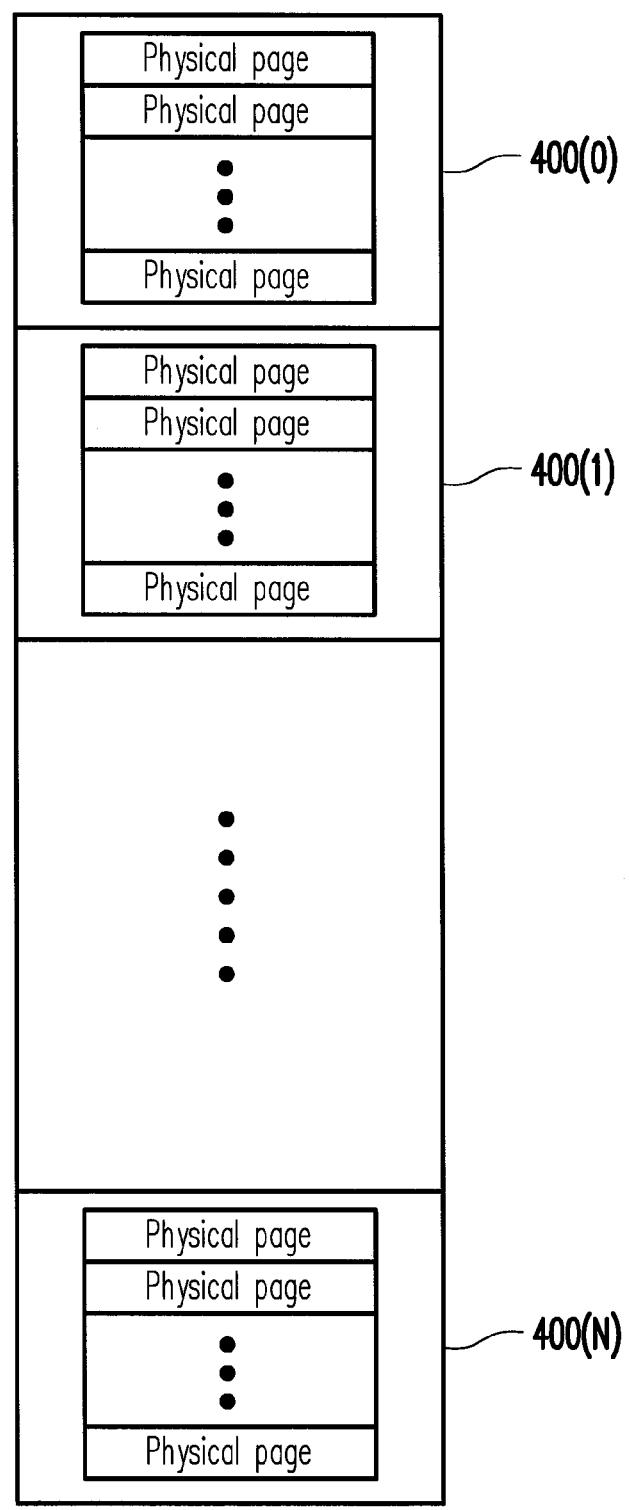
FIG. 8 is a schematic diagram of managing a rewritable non-volatile memory module according to an exemplary embodiment of the present invention.

FIG. 8 is a schematic diagram of managing a rewritable non-volatile memory module according to an exemplary embodiment of the present invention.

Referring to FIG. 8, the memory management circuit 702 groups the physical pages of the rewritable non-volatile memory module 106 into physical page groups 400(0)-400(N). In the present exemplary embodiment, the memory management circuit 702 groups the physical pages belonging to the same physical block into a physical page group. Namely, in the present exemplary embodiment, the physical pages in one physical page group are exactly the physical pages in one physical block. However, the invention is not limited thereto, and in another exemplary embodiment of the invention, the memory management circuit 702 may also group the physical pages belonging to the same plane into a physical page group or consider each individual physical page as a physical page group.

In the present exemplary embodiment, the memory management circuit 702 configures an independent threshold voltage set for each physical page group. For example, assuming the rewritable non-volatile memory module 106 to be a 4-level cell NAND flash memory module, each threshold voltage set includes a first threshold voltage VA, a second threshold voltage VB, and a third threshold voltage VC. Besides, the memory management circuit 702 reads data from the physical pages of a physical page group by applying the corresponding threshold voltage set.

For example, the memory management circuit 702 establishes a read voltage table to record the threshold voltage set corresponding to each physical page group. Besides, when data is to be read from a physical page, the memory management circuit 702 identifies the corresponding threshold voltage set in the read voltage table and reads the data by applying the corresponding threshold voltage set.

For example, when data is about to be read from a physical page of the physical page group 400(0), the memory management circuit 702 reads the data by applying the first threshold voltage VA, the second threshold voltage VB, and the third threshold voltage VC corresponding to the physical page group 400(0). And, when data is about to be read from a physical page of the physical page group 400(N), the memory management circuit 702 reads the data by applying the first threshold voltage VA, the second threshold voltage VB, and the third threshold voltage VC corresponding to the physical page group 400(N).

Particularly, in the present exemplary embodiment, when the ECC circuit 708 cannot correct data read from a physical page by the memory management circuit 702 and the number of error bits on the read data is not smaller than a error bit threshold, the compensation voltage calculating circuit 710 respectively calculates compensation voltages corresponding the threshold voltages of the corresponding threshold voltage set according to error bit information contained in these error bits. And, subsequently, when data is about to be read from the physical page group that this physical page belongs to, the memory management circuit 702 adjusts the threshold voltages of the corresponding threshold voltage set and applies the adjusted threshold voltages to read the data.

For example, if data is about to be read from a first physical page belonging to a first physical page group (for example, the physical page group 400(0)), the memory management circuit 702 applies a threshold voltage set (hereinafter referred to as "the first threshold voltage set") corresponding to the physical page group 400(0) to read uncorrected data (hereinafter referred to as 'the first data") from the first physical page. For example, if the first physical page is a lower page, the memory management circuit 702 applies a second threshold voltage VB corresponding to the physical page group 400(0) to identify the value of each bit in the first physical page. For example, if the first physical page is a upper page, the memory management circuit 702 applies a first threshold voltage VA and a third threshold voltage VC corresponding to the physical page group 400(0) to identify the value of each bit in the first physical page.

After completing the data reading, the ECC circuit 708 performs the ECC procedure on the first data according to an ECC code corresponding to the first data, and the memory management circuit 702 determines whether the first data can be corrected to generate corrected data.

If the ECC circuit 708 successfully corrects the first data to generate the corrected data, the memory management circuit 702 determines whether the number of error bits occurred on the first data is smaller than the error bit threshold based on the corrected data. If the number of error bits occurred on the first data is not smaller than the error bit threshold, the memory management circuit 702 instructs the compensation voltage calculating circuit 710 to calculate compensation voltages corresponding to the threshold voltages of the first threshold voltage set according to error bit information contained in the error bits. Subsequently, when data is about to be read from any physical page belonging to the physical page group 400(0), the memory management circuit 702 reads the data by applying the first threshold voltage set that is adjusted with the compensation voltages.

If the read uncorrected data can not be corrected, the memory management circuit 702 may perform a retry-read mechanism to re-read data from the first physical page. For example, in the retry-read mechanism, the memory management circuit 702 may try to read data from the first physical page by applying a different threshold voltage set. For example, the memory management circuit 702 may orderly use a voltage recorded in a table to adjust the threshold voltages, or increasing or decreasing the threshold voltages with a predetermined value. If the correct data can not be read after re-reading several times (for example, 5 times), the memory management circuit 702 outputs a reading-fail message. The retry-read mechanism is well-known to those skilled in the art, and the operation thereof is thus not illustrated herein.

In the present exemplary embodiment, the compensation voltage calculating circuit 710 may orderly compare each bit of the uncorrected data with each bit of the corrected data and thus identify error bits occurred on the uncorrected data. Herein, the so-called error bit means a bit which should be at a status is identified erroneously as being at another status. And, the compensation voltage calculating circuit 710 identifies the error bit types of these error bits, counts the number of error bit belonging to each of the error bit types as error bit information and calculates the compensation voltages according to the error bit information.

Figure 9:
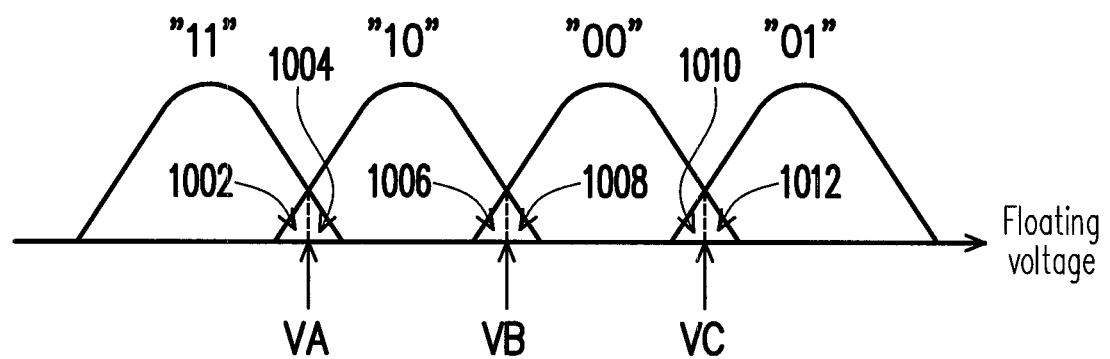
FIG. 9 is a distribution diagram illustrating error bit types of error bits according to an exemplary embodiment of the present invention.

FIG. 9 is a distribution diagram illustrating error bit types of error bits according to an exemplary embodiment of the present invention.

Referring to FIG. 9, taking a 4-level cell NAND flash memory as an example, the first threshold voltage VA is used for differentiating the storage state "11" from the storage state "10", the second threshold voltage VB is used for differentiating the storage state "10" from the storage state "00", and the third threshold voltage VC is used for differentiating the storage state "00" from the storage state "01". Herein the state to the left of a threshold voltage is referred to as a first storage state, and the state to the right of the threshold voltage is referred to as a second storage state.

In particular, regarding each threshold voltage, the compensation voltage calculating circuit 710 counts the number of memory cells that are in the first storage state but are mistaken as being in the second storage state (i.e., the first error bit type) and the number of memory cells that are in the second storage state but are mistaken as being in the first storage state (i.e., the second error bit type).

As shown in FIG. 9, the block 1002 represents the memory cells that are in the storage state "10" but are mistaken as being in the storage state "11", and the block 1004 represents the memory cells that are in the storage state "11" but are mistaken as being in the storage state "10". In particularly, the read voltage updating circuit 710 generates the compensation voltage corresponding to the first threshold voltage VA according to the number of error bits corresponding to the block 1002 and the number of error bits corresponding to the block 1004.

For example, the compensation voltage calculating circuit 710 calculates the compensation voltages by using following expression (3):

$$x = g \times \log_2\left(\frac{\text{error2}}{\text{error1}}\right) \quad (3)$$

In foregoing expression (3), x represents the compensation voltage, g is a constant, error2 is the number of memory cells that are in the second storage state but are mistaken as being in the first storage state, and error1 is the number of memory cells that are in the first storage state but are mistaken as being in the second storage state.

Similarly, the compensation voltage calculating circuit 710 generates the compensation voltage corresponding to the second threshold voltage VB according to the number of error bits corresponding to the block 1006 and the number of error bits corresponding to the block 1008.

Similarly, the compensation voltage calculating circuit 710 generates the compensation voltage corresponding to the third threshold voltage VC according to the number of error bits corresponding to the block 1010 and the number of error bits corresponding to the block 1012.

Accordingly, for example, If the number of error bits occurred on data read from one physical page of the physical page group 400(0) is not smaller than the error bit threshold, the memory management circuit 702 instructs the compensation voltage calculating circuit 710 to calculate compensation voltages corresponding to the threshold voltages of the threshold voltage set 400(0) according to the foregoing expression (3). And, subsequently, when data is about to be read from the physical pages of the physical page group 400(0), the memory management circuit 202 adds the calculated compensation voltage to the first threshold voltage VA to obtain a new first threshold voltage VC; adds the calculated compensation voltage to the second threshold voltage VB to obtain a new second threshold voltage VB and adds the compensation voltage to the third threshold voltage VC to obtain a new third threshold voltage VC.

Figure 10:
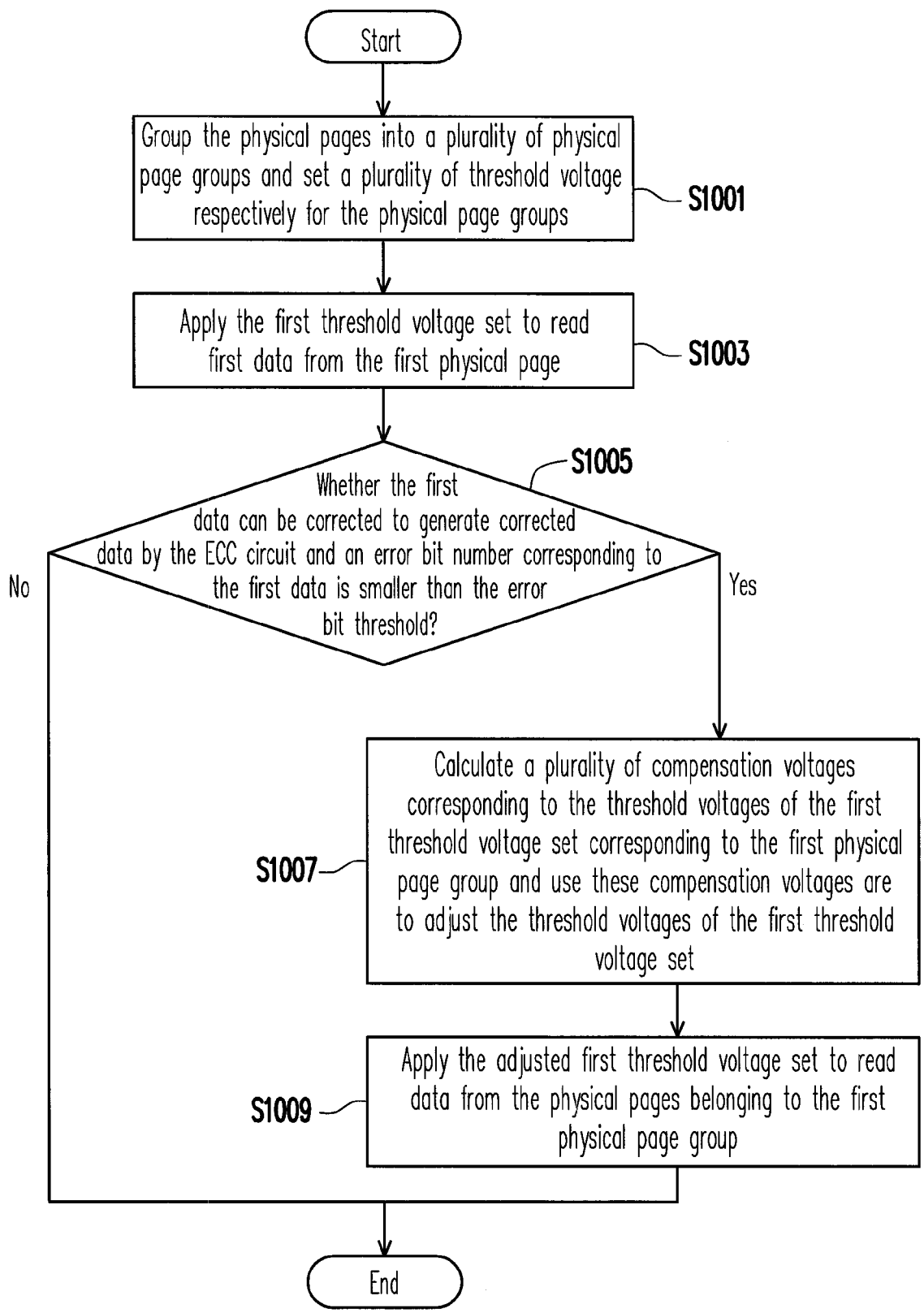
FIG. 10 is a schematic flowchart illustrating a data reading method according to an exemplary embodiment of the present invention.

FIG. 10 is a schematic flowchart illustrating a data reading method according to an exemplary embodiment of the present invention.

Referring to 10, in step S1001, the physical pages are grouped into a plurality of physical page groups and a plurality of threshold voltage respectively sets are set for the physical page groups. For example, the first threshold voltage set is set for a first physical page group among the physical page groups. It should be noted that, all initial threshold voltage sets of the physical page groups may be the same or different.

In step S1003, the first threshold voltage set is applied to read first data from the first physical page, wherein the first physical page belongs to the first physical page group. And, in step 1005, whether the first data can be corrected to generate corrected data by the ECC circuit and whether an error bit number corresponding to the first data is smaller than the error bit threshold are determined.

If the first data can be corrected to generate the corrected data by the ECC circuit and the error bit number corresponding to the first data is not smaller than the error bit threshold, in step S1007, a plurality of compensation voltages corresponding to the threshold voltages of the first threshold voltage set corresponding to the first physical page group are calculated and these compensation voltages are used to adjust the threshold voltages of the first threshold voltage set. Then, in step S1009, the adjusted first threshold voltage set is applied to read data (also referred to as the second data) from the physical pages belonging to the first physical page group.

In order to further understand the data reading method according to the present exemplary embodiment, an example will be provided for clearly explaining the steps of this data reading method.

Figure 11:
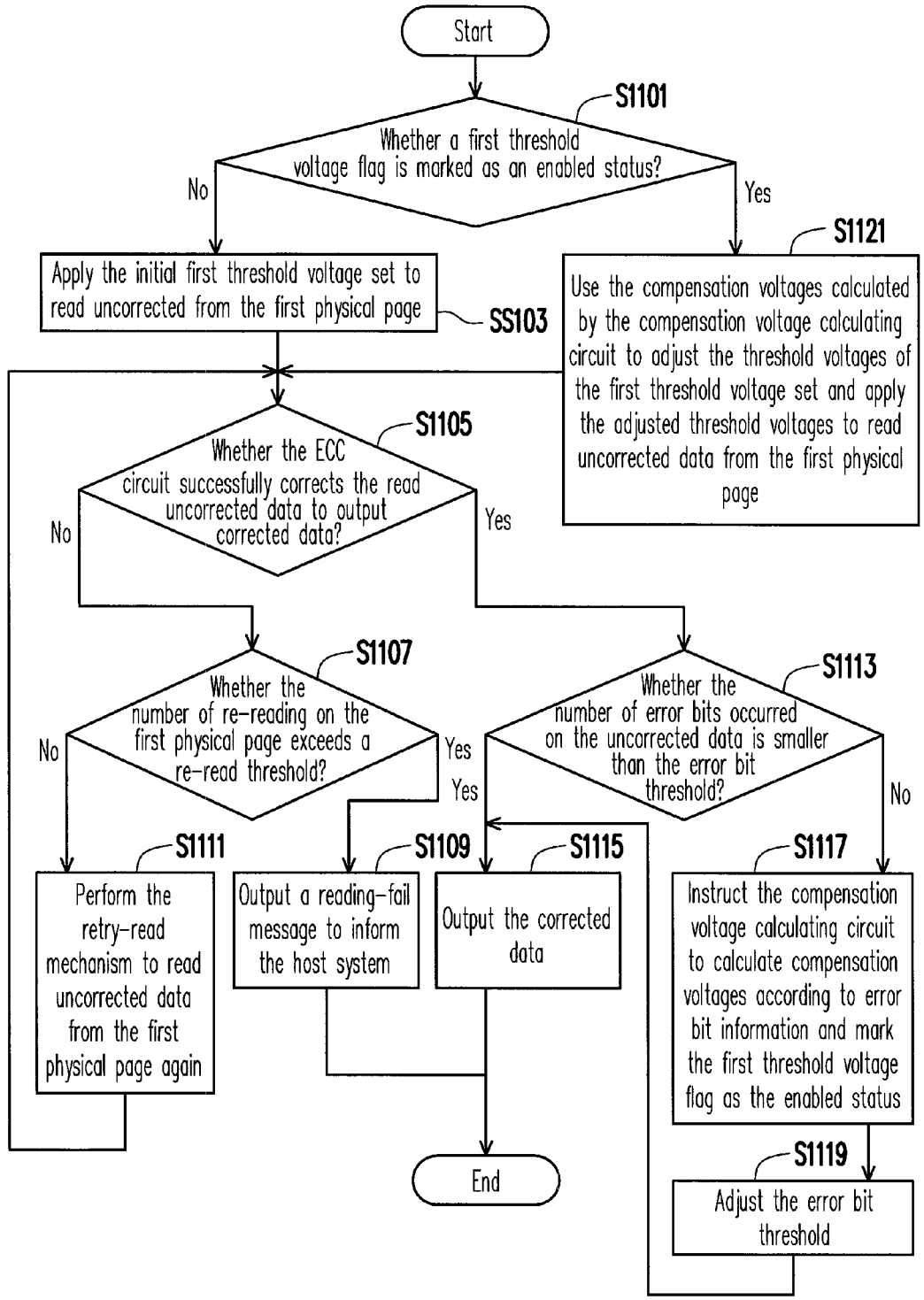
FIG. 11 is a detailed flowchart illustrating the data reading method according to an exemplary embodiment of the present invention.

FIG. 11 is a detailed flowchart illustrating the data reading method according to an exemplary embodiment of the present invention, wherein steps for reading data from one physical page are illustrated. In order to explain easily, herein, a physical page to be read is referred to as "the first physical page", a physical page group that the first physical page belongs to is referred to as "the first physical page group" and a threshold voltage set corresponding to the first physical page group is referred to as "the first threshold voltage set".

Referring to FIG. 11, in step S1101, the memory management circuit 702 determines whether a first threshold voltage flag is marked as an enabled status. To be specific, the memory management circuit 702 records a threshold voltage flag for each of the physical page groups and each of the threshold voltage flags are marked initially as a disabled status.

If the first threshold voltage flag is not marked as an enabled status, in step S1103, the memory management circuit 702 applies the initial first threshold voltage set to read uncorrected from the first physical page.

Then, in step S1105, the memory management circuit 702 determines whether the ECC circuit 708 successfully corrects the read uncorrected data to output corrected data.

If the ECC circuit 708 does not correct successfully the read uncorrected data to output the corrected data, in step S1107, the memory management circuit 702 determines whether the number of re-reading on the first physical page exceeds a re-read threshold. For example, the re-read threshold is set to be 5.

If the number of re-reading on the first physical page exceeds the re-read threshold, in step 1109, the memory management circuit 702 outputs a reading-fail message to inform the host system 1000.

If the number of re-reading on the first physical page does not exceed the re-read threshold, in step 1111, the memory management circuit 702 performs the retry-read mechanism to read uncorrected data from the first physical page again, and then the step S1105 is executed.

If the ECC circuit 708 corrects successfully the read uncorrected data to output the corrected data, in step S1113, the memory management circuit 702 determines whether the number of error bits occurred on the uncorrected data is smaller than the error bit threshold.

If the number of error bits occurred on the uncorrected data is smaller than the error bit threshold, in step S1115, the memory management circuit 702 outputs the corrected data.

If the number of error bits occurred on the uncorrected data is not smaller than the error bit threshold, in step S1117, the memory management circuit 702 instructs the compensation voltage calculating circuit 710 to calculate compensation voltages according to error bit information and marks the first threshold voltage flag as the enabled status. In step S1119, the memory management 702 adjusts the error bit threshold. To be specific, in the present exemplary embodiment, the error bit threshold is adjusted dynamically according to a status of each physical page group. For example, when the memory management circuit 702 instructs the compensation voltage calculating circuit 710 to compensation voltages for a physical page group, a predetermined adjustment value is added to an error bit threshold corresponding to the physical page group. For example, the predetermined adjustment value is set to be 5, but the present invention is not limited thereto. After that, step S1115 is executed.

Additionally, in another exemplary embodiment, the memory management circuit 702 may adjust the error bit thresholds according to the erase counts of the physical page groups. For example, when the erase count of a physical page group is not larger than 1000, the error bit threshold corresponding to this physical page group is set to be 20; when the erase count of a physical page group is between 1000 and 2000, the error bit threshold corresponding to this physical page group is set to be 30; and when the erase count of a physical page group is between 2000 and 3000, the error bit threshold corresponding to this physical page group is set to be 40. By the same token, the error bit threshold is increased along with the increase of the erase count.

If in step S1101, it is determined that the first threshold voltage flag is not marked as the enabled status, in step S1121, the memory management circuit 702 uses the compensation voltages calculated by the compensation voltage calculating circuit 710 to adjust the threshold voltages of the first threshold voltage set and applies the adjusted threshold voltages to read uncorrected data from the first physical page.

In summary, in the present exemplary embodiment, threshold voltage sets for the physical page groups are adjusted dynamically according to the wear degrees of the physical page groups. Therefore, the accuracy of the read data can be ensured more effectively. Additionally, in the present exemplary embodiment, compensation voltages are calculated when the number of error bits occurred on data read from a physical page is smaller than the error bit threshold and the error bit threshold is adjusted dynamically. Accordingly, in the present exemplary embodiment, compensation voltages for adjusting threshold voltages of one physical page group is calculated according to a status of a physical page in which the most error bits occur among the physical pages of this physical page group, and thus the adjusted threshold voltage set can be applied for correctly reading data. The previously described exemplary embodiments of the present invention have the advantages aforementioned, wherein the advantages aforementioned not required in all versions of the present invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data reading method for a rewritable non-volatile memory module, wherein the rewritable non-volatile memory module has a plurality of physical pages, the data reading method comprising:
   grouping the physical pages into a plurality of physical page groups;
   setting a first threshold voltage set for a first physical page set among the physical page groups;
   applying the first threshold voltage set to read first data from a first physical page, wherein the first physical page belongs to the first physical page group;
   calculating a plurality of compensation voltages corresponding to the threshold voltages of the first threshold voltage set when the first data is corrected by an error checking and correcting circuit to generate corrected data and an error bit number corresponding to the first data is not smaller than an error bit threshold;
   using the compensation voltages to adjust the threshold voltages of the first threshold voltage set; and
   applying the adjusted threshold voltages of the first threshold voltage set to read data from the physical pages belonging to the first physical page group.

2. The data reading method according to claim 1, further comprising:
   dynamically adjusting the error bit threshold according to an erase count corresponding to the first physical page group.

3. The data reading method according to claim 1, further comprising:
   after calculating the compensation voltages corresponding to the threshold voltages of the first threshold voltage set, using a predetermined adjustment value to adjust the error bit threshold.

4. The data reading method according to claim 1, wherein the step of calculating the compensation voltages corresponding to the threshold voltages of the first threshold voltage set comprises:
   obtaining error bit information by comparing the first data to the corrected data; and
   calculating the compensation voltages according to the error bit information.

5. The data reading method according to claim 1, wherein the first physical page is a physical page in which the most error bits occur among the physical pages of the first physical page group.

6. A memory controller for controlling a rewritable non-volatile memory module, wherein the rewritable non-volatile memory module has a plurality of physical pages, the memory controller comprising:
   a memory management circuit, configured to group the physical pages into a plurality of physical page groups and respectively set a plurality of threshold voltage sets for the physical page groups, wherein a first threshold voltage set among the threshold voltage sets corresponds to a first physical page group among the physical page groups and the first threshold voltage set includes a plurality of threshold voltages;
   a host interface, coupled to the memory management circuit;
   a memory interface, coupled to the memory management circuit and configured for coupling to the rewritable non-volatile memory module;
   an error checking and correcting circuit, coupled to the memory management circuit; and
   a compensation voltage calculating circuit, coupled to the memory management circuit,
   wherein the memory management circuit applies the first threshold voltage set to read first data from a first physical page belonging to the first physical page group,
   wherein when the error checking and correcting circuit successfully corrects the first data to generate corrected data and an error bit number corresponding to the first data is not smaller than an error bit threshold, the compensation voltage calculating circuit calculates a plurality of compensation voltages corresponding to the threshold voltages of the first threshold voltage set.

7. The memory controller according to claim 6, wherein the memory management circuit uses the compensation voltages to adjust the threshold voltages of the first threshold voltage set and applies the adjusted threshold voltages of the first threshold voltage set to read data from the physical pages of the first physical page group.

8. The memory controller according to claim 6, wherein the memory management circuit dynamically adjusts the error bit threshold according to an erase count corresponding to the first physical page group.

9. The memory controller according to claim 6, wherein the memory management circuit uses a predetermined adjustment value to adjust the error bit threshold after the compensation voltages corresponding to the threshold voltages of the first threshold voltage set are calculated.

10. The memory controller according to claim 6, wherein the compensation voltage calculating circuit obtains error bit information by comparing the first data to the corrected data and calculates the compensation voltages according to the error bit information.

11. The memory controller according to claim 6, wherein the first physical page is a physical page in which the most error bits occur among the physical pages of the first physical page group.

12. A memory storage apparatus, comprising:
   a connector, configured to couple to a host system;
   a rewritable non-volatile memory module, having a plurality of physical pages; and
   a memory controller, coupled to the connector and the rewritable non-volatile memory module, wherein the memory controller has an error checking and correcting circuit,
   wherein the memory controller is configured to group the physical pages into a plurality of physical page groups and respectively set a plurality of threshold voltage sets for the physical page groups, wherein a first threshold voltage set among the threshold voltage sets corresponds to a first physical page group among the physical page groups and the first threshold voltage set includes a plurality of threshold voltages,
   wherein the memory controller applies the first threshold voltage set to read first data from a first physical page belonging to the first physical page group,
   wherein when the error checking and correcting circuit successfully corrects the first data to generate corrected data and an error bit number corresponding to the first data is not smaller than an error bit threshold, the memory controller calculates a plurality of compensation voltages corresponding to the threshold voltages of the first threshold voltage set.

13. The memory storage apparatus according to claim 12, wherein the memory controller uses the compensation voltages to adjust the threshold voltages of the first threshold voltage set and applies the adjusted threshold voltages of the first threshold voltage set to read data from the physical pages of the first physical page group.

14. The memory storage apparatus according to claim 12, wherein the memory controller dynamically adjusts the error bit threshold according to an erase count corresponding to the first physical page group.

15. The memory storage apparatus according to claim 12, wherein the memory controller uses a predetermined adjustment value to adjust the error bit threshold after the compensation voltages corresponding to the threshold voltages of the first threshold voltage set are calculated.

16. The memory storage apparatus according to claim 12, wherein the memory controller obtains error bit information by comparing the first data to the corrected data and calculates the compensation voltages according to the error bit information.

17. The memory storage apparatus according to claim 12, wherein the first physical page is a physical page in which the most error bits occur among the physical pages of the first physical page group.

18. A data reading method for reading data from a first physical page of a rewritable non-volatile memory module, wherein the rewritable non-volatile memory module has a plurality of physical pages, the physical pages are grouped into a plurality of physical page groups, the first physical page. belongs to a first physical page group among the physical page groups, a first threshold voltage set and a first threshold voltage flag are set for the first physical page group, the first threshold voltage set includes a plurality of threshold voltages and the first threshold voltage flag is marked initially as a disabled status, the data reading method comprising:
   determining whether the first threshold voltage flag is marked as an enabled status;
   when the first threshold voltage flag is not marked as the enabled status, applying the first threshold voltage set to read first data from the first physical page and determining whether the first data read from the first physical page is corrected to generate corrected data by an error checking and correcting circuit;
   when the first data is corrected to generate the corrected data by the error checking and correcting circuit, determining whether an error bit number corresponding to the first data is smaller than an error bit threshold; and
   when the error bit number corresponding to the first data is not smaller than the error bit threshold, calculating a plurality of compensation voltages corresponding to the threshold voltages of the first threshold voltage set and marking the first threshold voltage flag as the enabled status.

19. The data reading method according to claim 18, further comprising:
   when the first threshold voltage flag is marked as the enabled status, using the compensation voltages to adjust the threshold voltages of the first threshold voltage set and applying the adjusted threshold voltages of the first threshold voltage set to read second data from the first physical page.

20. The data reading method according to claim 18, further comprising:
   dynamically adjusting the error bit threshold according to an erase count corresponding to the first physical page group.

21. The data reading method according to claim 18, further comprising:
   after calculating the compensation voltages corresponding to the threshold voltages of the first threshold voltage set, using a predetermined adjustment value to adjust the error bit threshold.

22. The data reading method according to claim 18, wherein the step of calculating the compensation voltages corresponding to the threshold voltages of the first threshold voltage set comprises:
   obtaining error bit information by comparing the first data to the corrected data; and
   calculating the compensation voltages according to the error bit information.

23. The data reading method according to claim 22, wherein the first data has a plurality of bits, the rewritable non-volatile memory module has a plurality of storage states, each of the bits is corresponding to one of the storage states of the rewritable non-volatile memory module, the storage states includes a first storage state and a second storage state, and a first threshold voltage among the threshold voltages is used for differentiating the first storage state from the second storage state, wherein the step of obtaining the error bit information by comparing the first data to the corrected data comprises:

finding out a plurality of error bits among the bits of the first data that are different from corresponding bits of the corrected data;

counting the number of error bits that belong to a first error bit type among the error bits, wherein the error bits belonging to the first error bit type are corresponding to the first storage state but are mistaken as being corresponding to the second storage state;

counting the number of error bits that belong to a second error bit type among the error bits, wherein the error bits belonging to the second error bit type are corresponding to the second storage state but are mistaken as being corresponding to the first storage state; and serving the number of the error bits belonging to the first error bit type and the number of the error bits belonging to the second error bit type as the error bit information.

wherein the step of calculating the compensation voltages according to the error bit information comprises:

calculating a first compensation voltage among the compensation voltages according to the number of the error bits belonging to the first error bit type and the number of the error bits belonging to the second error bit type, wherein the first compensation voltage is used for adjusting a first threshold voltage among the threshold voltages.

24. The data reading method according to claim 18, wherein the first physical page is a physical page in which the most error bits occur among the physical pages of the first physical page group.

* * * * *